(12) United States Patent
Ng et al.

(10) Patent No.: US 10,331,181 B2
(45) Date of Patent: Jun. 25, 2019

(54) EXPANSION CARD HOLDER

(71) Applicant: Super Micro Computer Inc., San Jose, CA (US)

(72) Inventors: Pae Yoong Ng, San Jose, CA (US); Lawrence H. Liang, San Jose, CA (US); Richard S. Chen, San Jose, CA (US); Pak Kai Ho, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 14 days.

(21) Appl. No.: 15/470,896

(22) Filed: Mar. 27, 2017

(65) Prior Publication Data

US 2018/0188783 A1    Jul. 5, 2018

(30) Foreign Application Priority Data

Dec. 29, 2016 (TW) .............................. 105219918 U (51) Int. Cl.
| | |
|---|---|
| *G06F 1/16* | (2006.01) |
| *H05K 5/00* | (2006.01) |
| *H05K 7/00* | (2006.01) |
| *G06F 1/18* | (2006.01) |
| *H05K 7/14* | (2006.01) |

(52) U.S. Cl.
CPC ............. *G06F 1/185* (2013.01); *H05K 7/142* (2013.01)

(58) Field of Classification Search
CPC ................................................ G06F 1/18–186
USPC ........................................ 361/679.4–679.44
See application file for complete search history.

(56) References Cited

U.S. PATENT DOCUMENTS

| | | | | |
|---|---|---|---|---|
| 5,754,412 A | * | 5/1998 | Clavin | H05K 7/142 174/138 D |
| 6,603,664 B1 | * | 8/2003 | Gallarelli | G06F 1/16 361/679.01 |
| 7,004,764 B2 | * | 2/2006 | Boudreau | H05K 7/142 174/138 G |
| 7,184,278 B2 | * | 2/2007 | Tsai | G06F 1/203 361/752 |
| 7,335,032 B1 | * | 2/2008 | Lee | G06F 1/185 439/76.1 |
| 7,649,750 B2 | * | 1/2010 | Lee | H05K 7/1405 361/732 |
| 8,098,497 B2 | * | 1/2012 | Chiang | H05K 7/142 361/736 |
| 9,439,320 B2 | * | 9/2016 | Chen | H05K 7/1461 |
| 9,952,634 B2 | * | 4/2018 | Samper | G06F 1/183 |

(Continued)

*Primary Examiner* — Anthony M Haughton
(74) *Attorney, Agent, or Firm* — Chun-Ming Shih; HDLS IPR Services (57) ABSTRACT

An expansion card holder for fixing an expansion card on a circuit board is provided. A connector is arranged on the circuit board and an end of the expansion card is coupled with the connector. The expansion card holder includes a carrier plate, a positioning buckle and a pressing block. The carrier plate is fixed on the circuit board, and multiple position holes arranged in a row are defined on the carrier plate. The positioning buckle is inserted in one of the position holes and engaged with the circuit board. The pressing block is inserted in another one of the position holes and engaged with the expansion card. The expansion card holder is thereby compatible with various sizes of expansion cards.

14 Claims, 15 Drawing Sheets

(56) References Cited

U.S. PATENT DOCUMENTS

2016/0021777 A1* 1/2016 Jimenez, III ......... H05K 7/1418
361/679.58

* cited by examiner

EXPANSION CARD HOLDER

BACKGROUND OF THE INVENTION

Technical Field

The present disclosure is related to an expansion card holder, particularly a M.2 expansion card holder.

Description of Related Art

An M.2 expansion card is a typical type of expansion card used in a host server. In general, the M.2 connector is arranged on a circuit board of in the host server, an edge of the M.2 expansion card is coupled with the M.2 connector and the M.2 expansion card is stacked on the circuit board, another edge of the M.2 expansion card is generally fixed on the circuit board by a screw bolt. Therefore, the conventional M.2 expansion card is inconvenient for installing.

Moreover, an M.2 connector is a general type connector, but conventional M.2 expansion cards have various sizes, are generally of a strip shape and have various length sizes. Therefore, a screw hole according to predetermined M.2 expansion card should be defined on a circuit board, and another expansion card with a different length size is incompatible.

In views of this, in order to solve the above disadvantages, the present inventor studied related technology and provided a reasonable and effective solution in the present disclosure.

SUMMARY

An expansion card holder compatible with various sizes of expansion cards and various sizes of installation spaces is provided in the present disclosure.

An expansion card holder for fixing an expansion card on a circuit board is provided in the present disclosure. A connector is arranged on the circuit board, an end of the expansion card is coupled with the connector and the expansion card is stacked on the circuit board. The expansion card holder includes a carrier plate, a positioning buckle and a pressing block. The carrier plate is fixed on the circuit board, and multiple position holes arranged in a row are defined on the carrier plate. The positioning buckle is inserted in one of position holes and engaged with the circuit board. The pressing block is inserted in another one of the position holes and engaged with the expansion card.

According to the expansion card holder of the present disclosure, a couple of walls arranged at interval are formed on the pressing block, and the carrier plate is clamped by the couple of walls. The position hole is an elongated hole of a shape matched with the wall, the pressing block is inserted in the position hole and further twisted, and the carrier plate is thereby clamped by the couple of walls. A snapping hole nearby at least one of the position holes is defined on the carrier plate, a protruding block is arranged on one of the walls of the pressing block, and the protruding block is engaged with the snapping hole of the position hole containing the pressing block.

According to the expansion card holder of the present disclosure, the pressing block includes a shaft sleeve and a fixing rod, and the fixing rod is inserted in the shaft sleeve. The fixing rod is screw connected with the shaft sleeve. The pressing block including a connecting strip, two ends of the connecting strip are respectively connected with the shaft sleeve and the fixing rod, a folding groove is formed on the connecting strip and the folding groove is extended along a lateral direction of the connecting strip, a couple of reinforcing ribs are formed on the connecting strip at respective ends of the folding groove.

According to the expansion card holder of the present disclosure, a wall is formed on the positioning buckle and the wall is in contact with the carrier plate. The positioning buckle is inserted in the position hole and twisted, and the wall is thereby contacted with the carrier plate. A snapping hole adjacent to at least one of the position holes is defined on the carrier plate, a protruding block is protruded on the wall of the positioning buckle, and the protruding block is engaged with the snapping hole near by the position hole containing the positioning buckle. Multiple concave recesses are formed on the carrier plate and each position hole is formed at bottom of each recesses, the wall of the positioning buckle is received in corresponding recess.

According to the expansion card holder of the present disclosure, at least a supporting arm is extended from the positioning buckle. At least a broken-hole line is defined on the carrier plate, and the broken-hole line is extended along a lateral direction of the row of position holes. Multiple legs for raising the carrier plate are extended from the carrier plate. A leg for fixing the carrier plate is extended from the carrier plate.

The expansion card holder of the present disclosure has a carrier plate compatible with various sizes of expansion cards, and the expansion card is thereby fixed on a circuit board. Moreover, the expansion card holder of the present disclosure is also comp compatible with various installation spaces.

BRIEF DESCRIPTION OF DRAWING

The present disclosure can be more fully understood by reading the following detailed description of the embodiment, with reference made to the accompanying drawings as follows.

DETAILED DESCRIPTION

Figure 1:
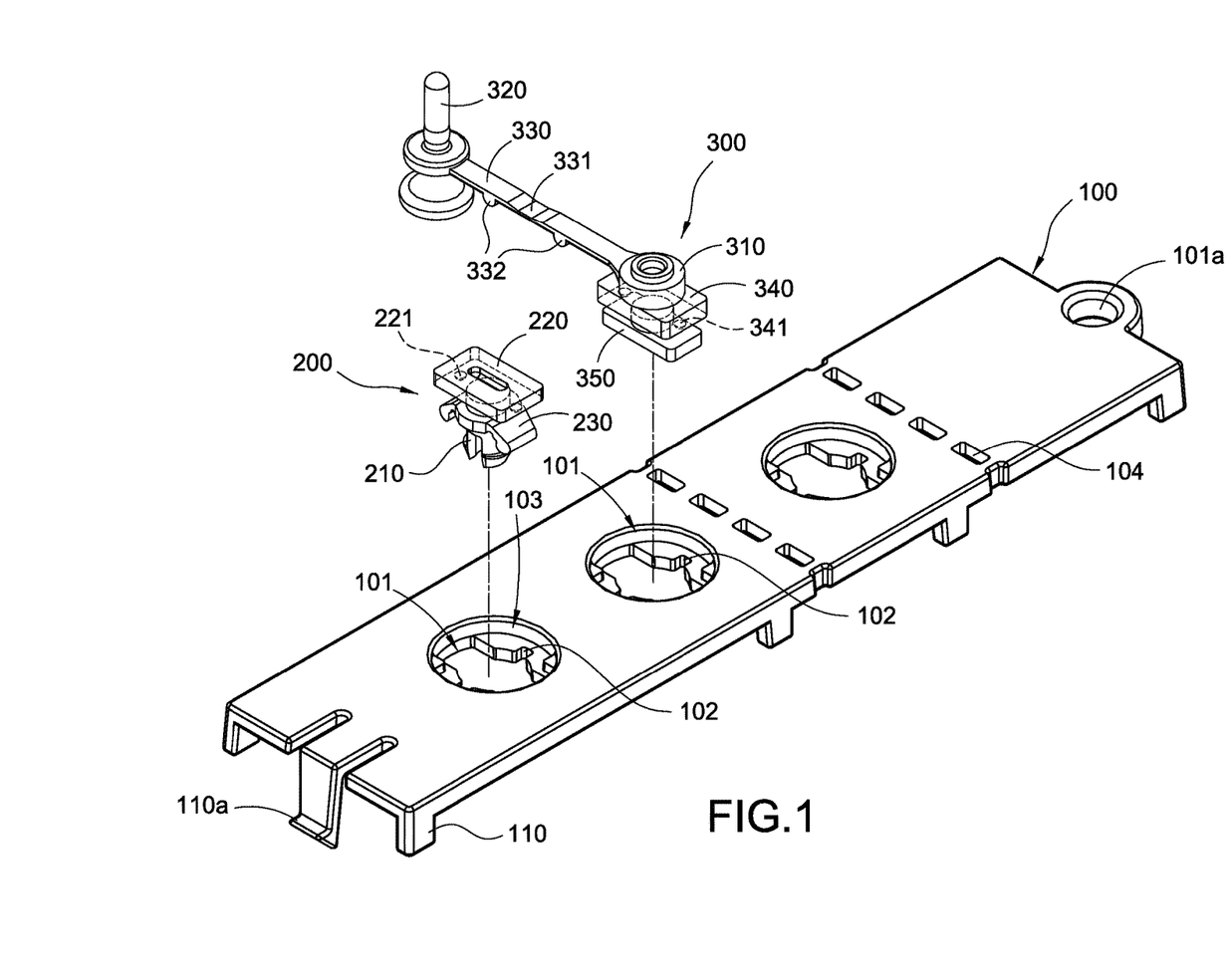
FIG. 1 is an exploded view showing the expansion card holder of an embodiment of the present disclosure.
Figure 2:
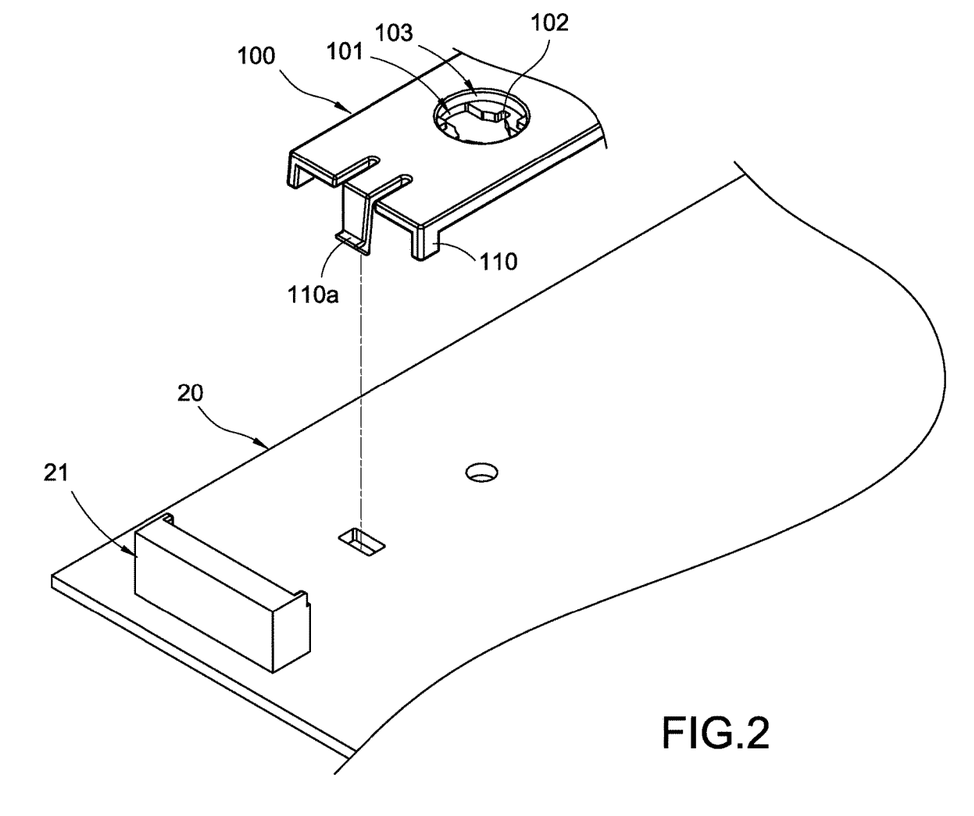
FIG. 2 is a schematic diagram showing a usage of the carrier the plate of the expansion card holder of the present embodiment of the present disclosure.

Please refer to FIG. 1, an expansion card holder including a carrier plate 100, a positioning buckle 200 and a pressing block 300 is provided in the present disclosure.

In the present embodiment, the carrier plate 100 is preferably a plate of a strip shape, multiple position holes 101 are defined on the carrier plate 100, and these position holes 101 are arranges in a row along a longitudinal direction of the carrier plate 100. In the present embodiment, multiple rectangular position holes 101 and a circular position hole 101 are preferably defined on the carrier plate 100, but the number and the shape of the position holes 101 should not be limited by the present embodiment. A snapping hole 102 is preferably defined adjacent to each rectangular position hole 101. In the present embodiment, a snapping hole 102 is defined nearby each long side of each rectangular position hole 101, and the snapping hole 102 could be communicated with the position hole 101 or separated from the position hole 101. Multiple concave recesses 103 could be defined on the carrier plate 100 and the respective position holes 101 are formed at bottom of respective recesses 103, however, the present disclosure should not be limited by the present embodiment. Furthermore, at least a leg 110a/110a is extended from the carrier plate 100, and the legs 110/110a are extended along the same direction perpendicular with the carrier plate 100.

The positioning buckle 200 is inserted in one of the position hole 101, and the pressing block 300 is inserted in another position hole 101.

The positioning buckle 200 has at least an arm latch 210, and a wall 220 and at least a supporting arm 230 are extended from a lateral surface of the arm latch 210. The arm latch 210 is inserted in one of position hole 101, at least a protruding block 221 is arranged protruding on the wall 220 of the positioning buckle 200. In the present embodiment, the positioning buckle 200 preferably has a couple of supporting arm 230 with the same structure and function, however, the number thereof should not be limited by the present embodiment, and the couple of supporting arm 230 could be inserted through the position hole 101 while the positioning buckle 200 is inserted in the position hole 101.

The pressing block 300 includes a shaft sleeve 310, a fixing rod 320 and a connecting strip 330, and respective ends of the connecting strip 330 are connected with the shaft sleeve 310 and the fixing rod 320. A couple of walls 340/350 are arranged at interval and protruding on a lateral surface of the shaft sleeve 310. In the present embodiment, at least one of the wall 350 is of a rectangular shape matching with the position hole 101, and the wall 350 thereby could be inserted through the position hole 101 while the shaft sleeve 310 is inserted in corresponding position hole 101. Moreover, at least a protruding block 341 is arranged protruding on one of the walls 340 of the pressing block 300. a folding groove 331 is formed on a middle segment of the connecting strip 330, the folding groove 331 is extended along a lateral direction of the connecting strip 330, and a couple of reinforcing ribs 332 protruding on the connecting strip 330 are respectively arranged at two ends of the folding groove 331.

Figure 10:
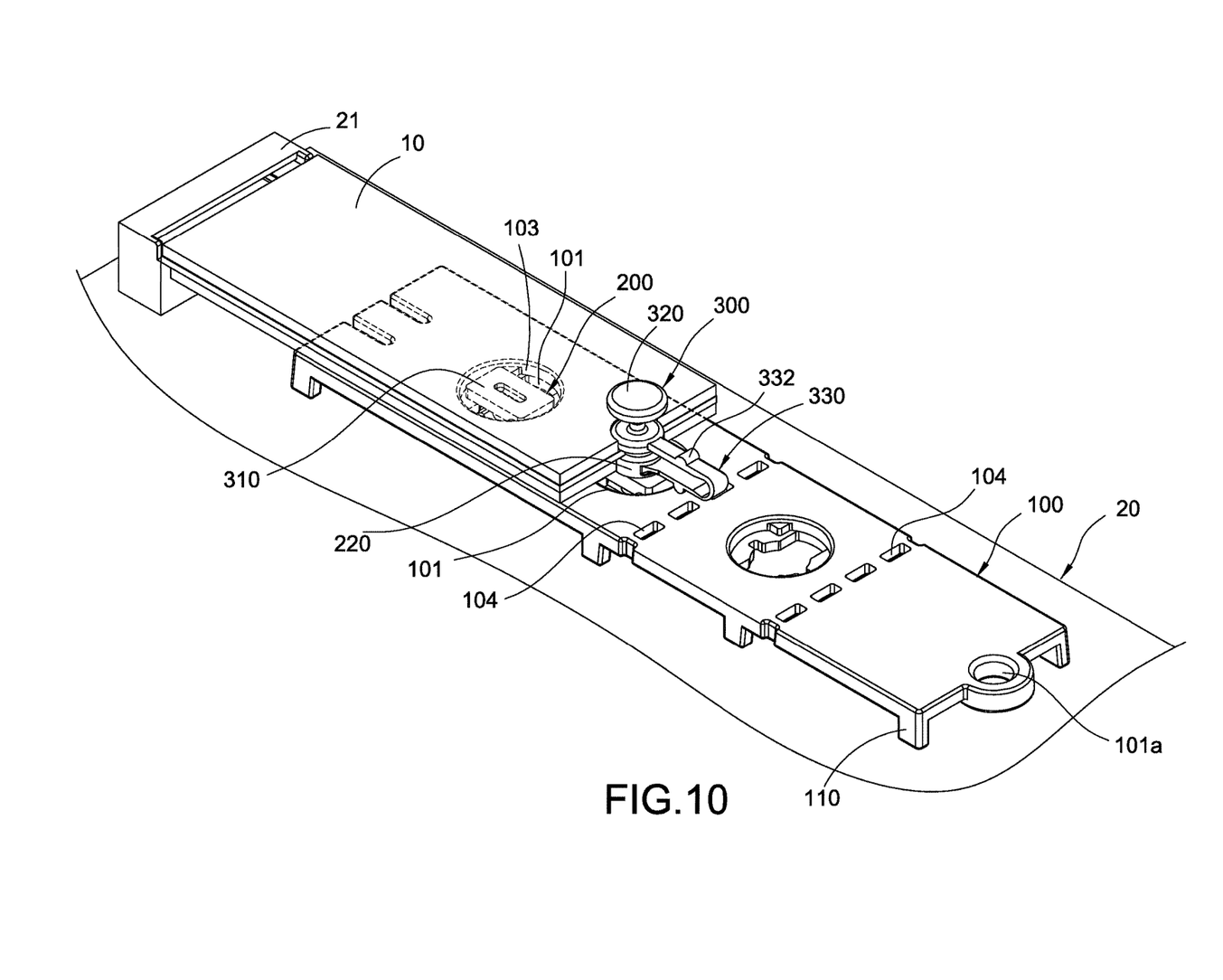
FIG. 10 is a schematic diagram showing a usage of the expansion card holder of the present embodiment of the present disclosure.

Please refer to FIG. 10, the expansion card holder of the present disclosure is used to fix an expansion card 10 on a circuit board 20, a connector 21 is arranged on the circuit board 20, and an end of the expansion card 10 is coupled with the connector 21.

Please refer to FIG. 2 to FIG. 5, the carrier plate 100 is fixed on circuit board 20 with the connector 21 and at the same surface of the circuit board 20, the legs 110 of the carrier plate 100 are contacted with the circuit board 20 to position height of the carrier plate 100 on the circuit board 20, and the legs 110a could be further embedded in the circuit board 20 to position location of the carrier plate 100 on the surface of circuit board 20.

Figure 3:
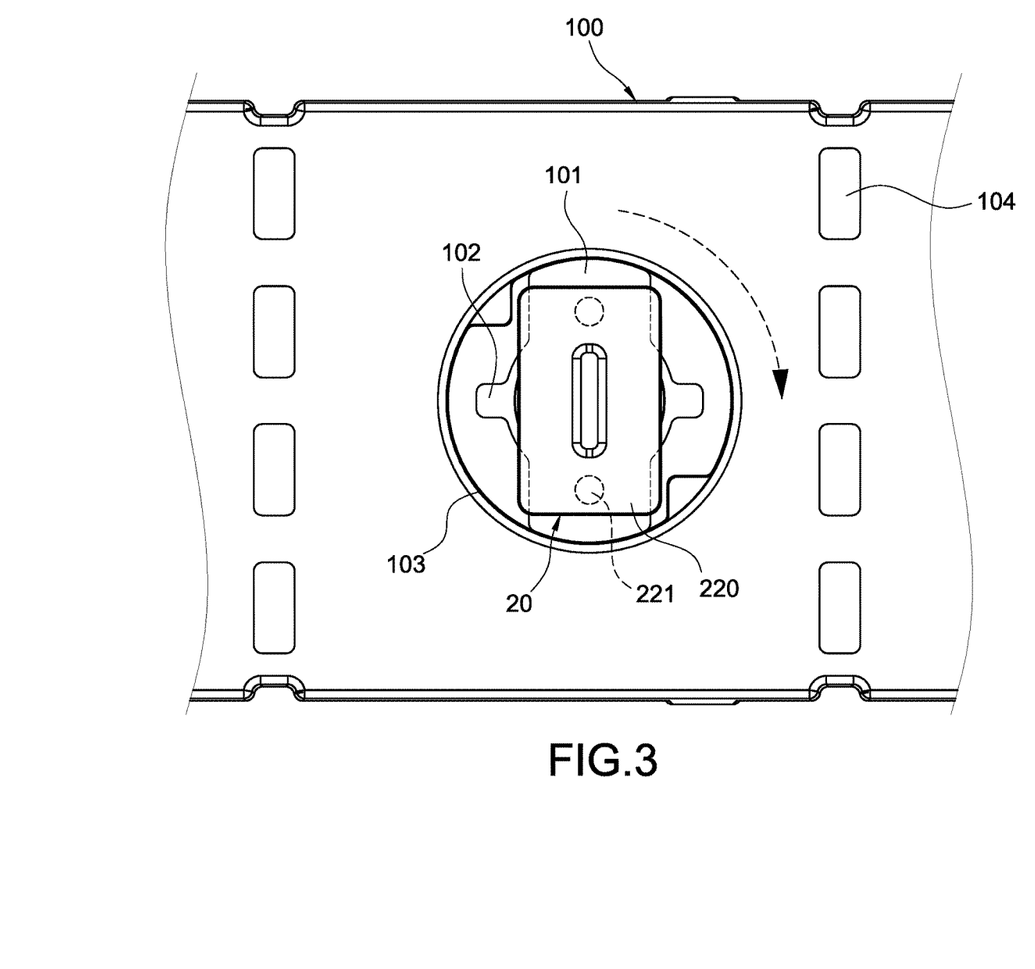
FIGS. 3 to 5 are schematic diagrams showing a usage of the positioning buckle of the expansion card holder of the present embodiment of the present disclosure.
Figure 4:
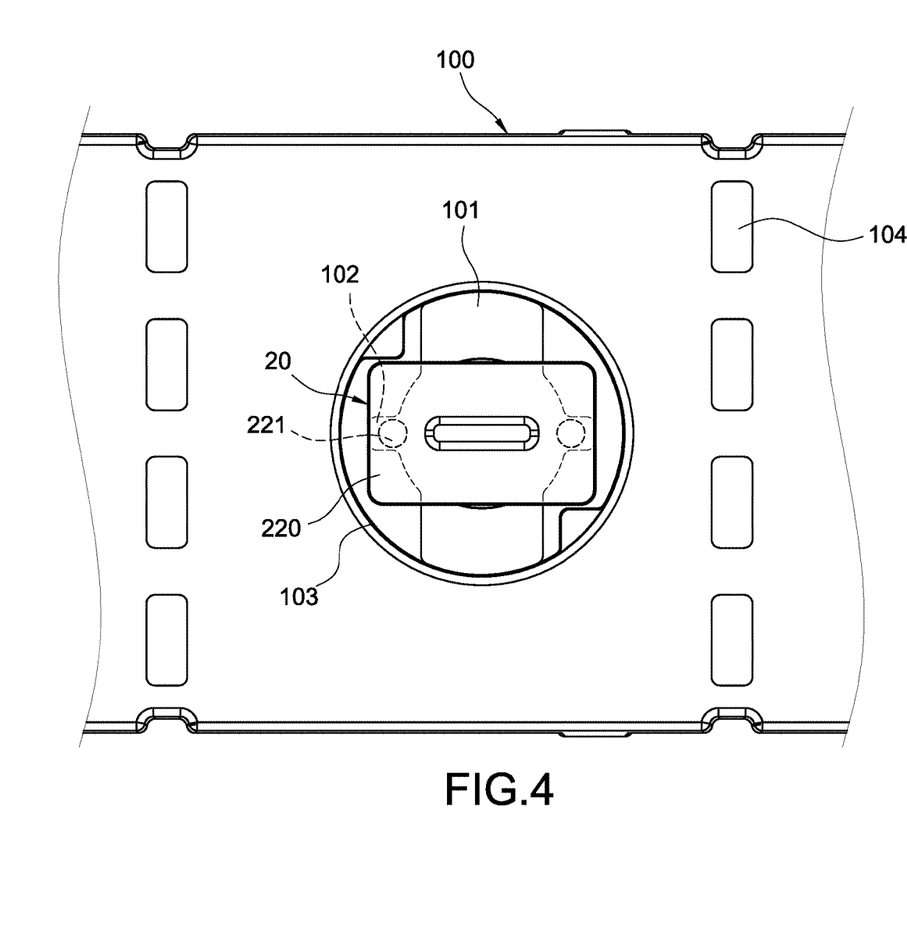
Figure 5:
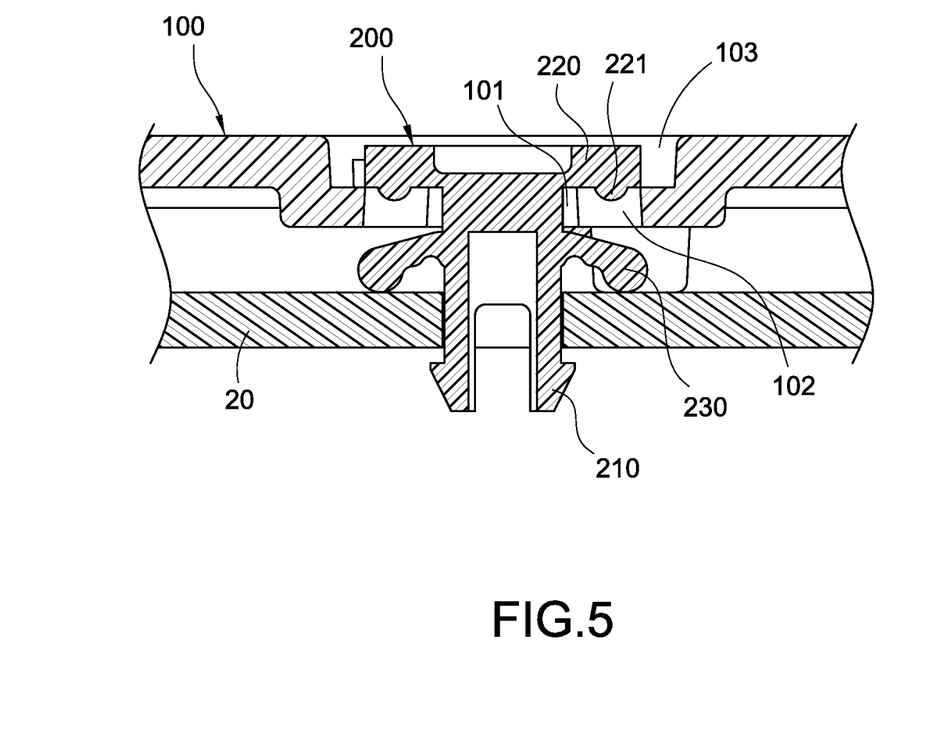
Figure 6:
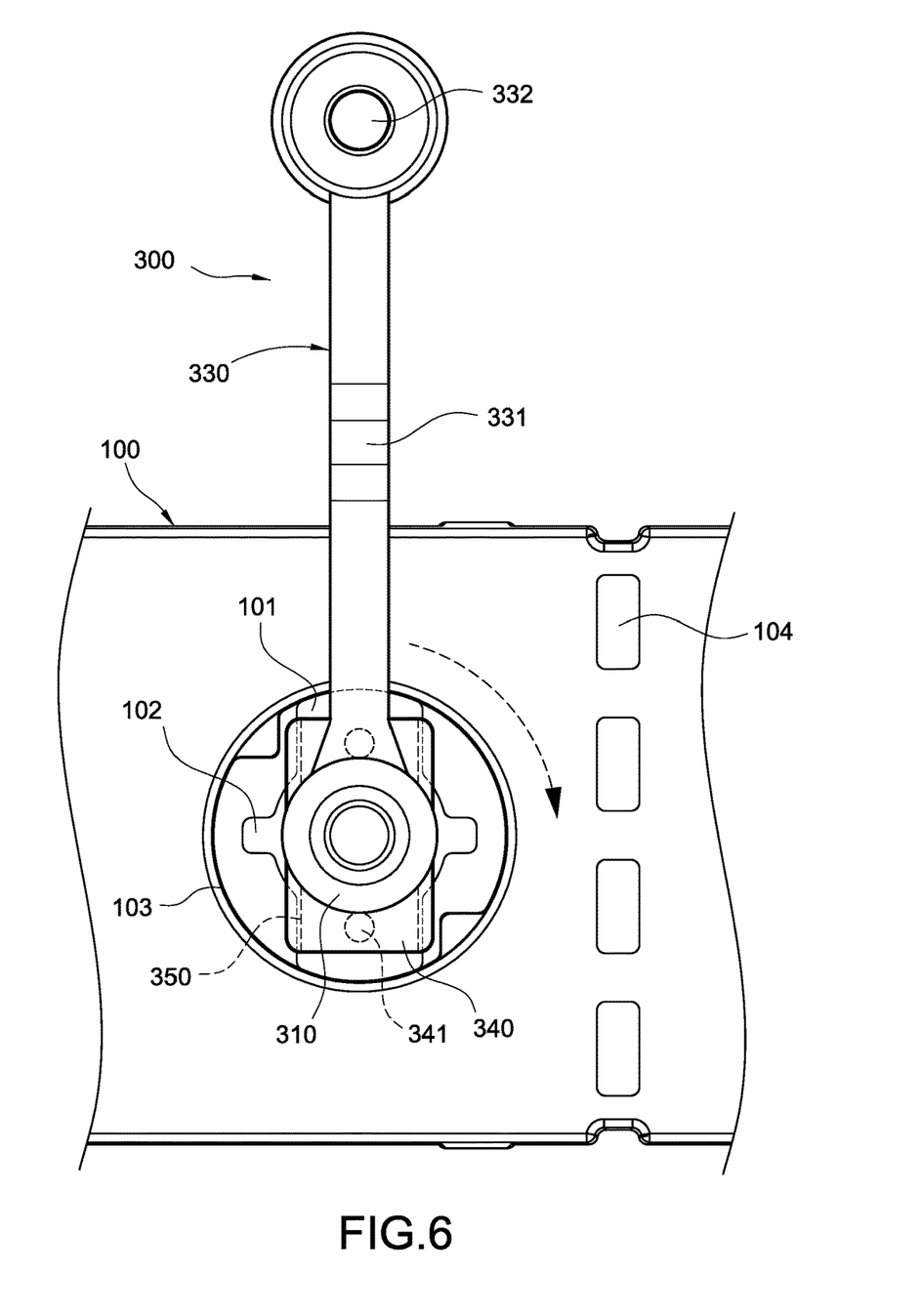
FIGS. 6 to 9 are schematic diagrams showing a usage of the pressing block of the expansion card holder of the present embodiment of the present disclosure.
Figure 7:
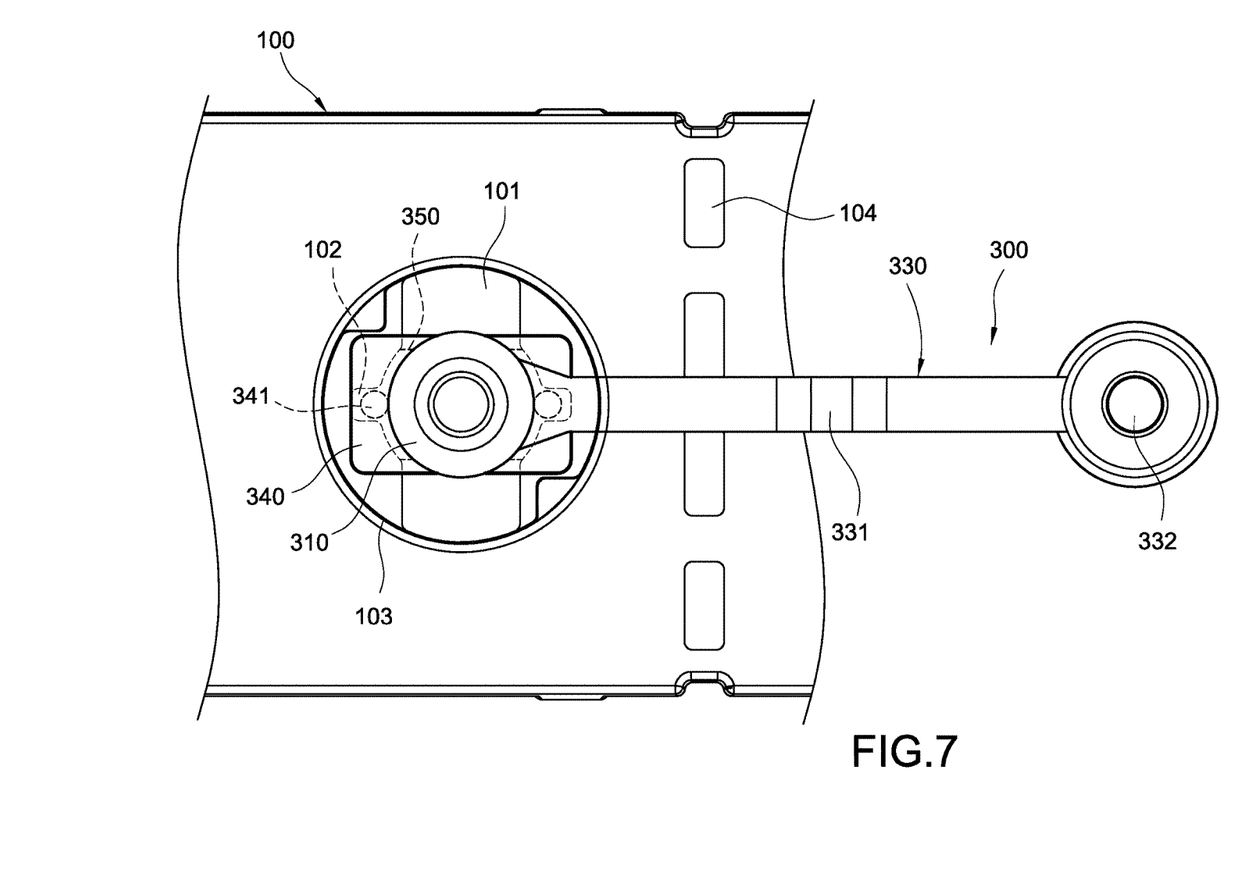
Figure 8:
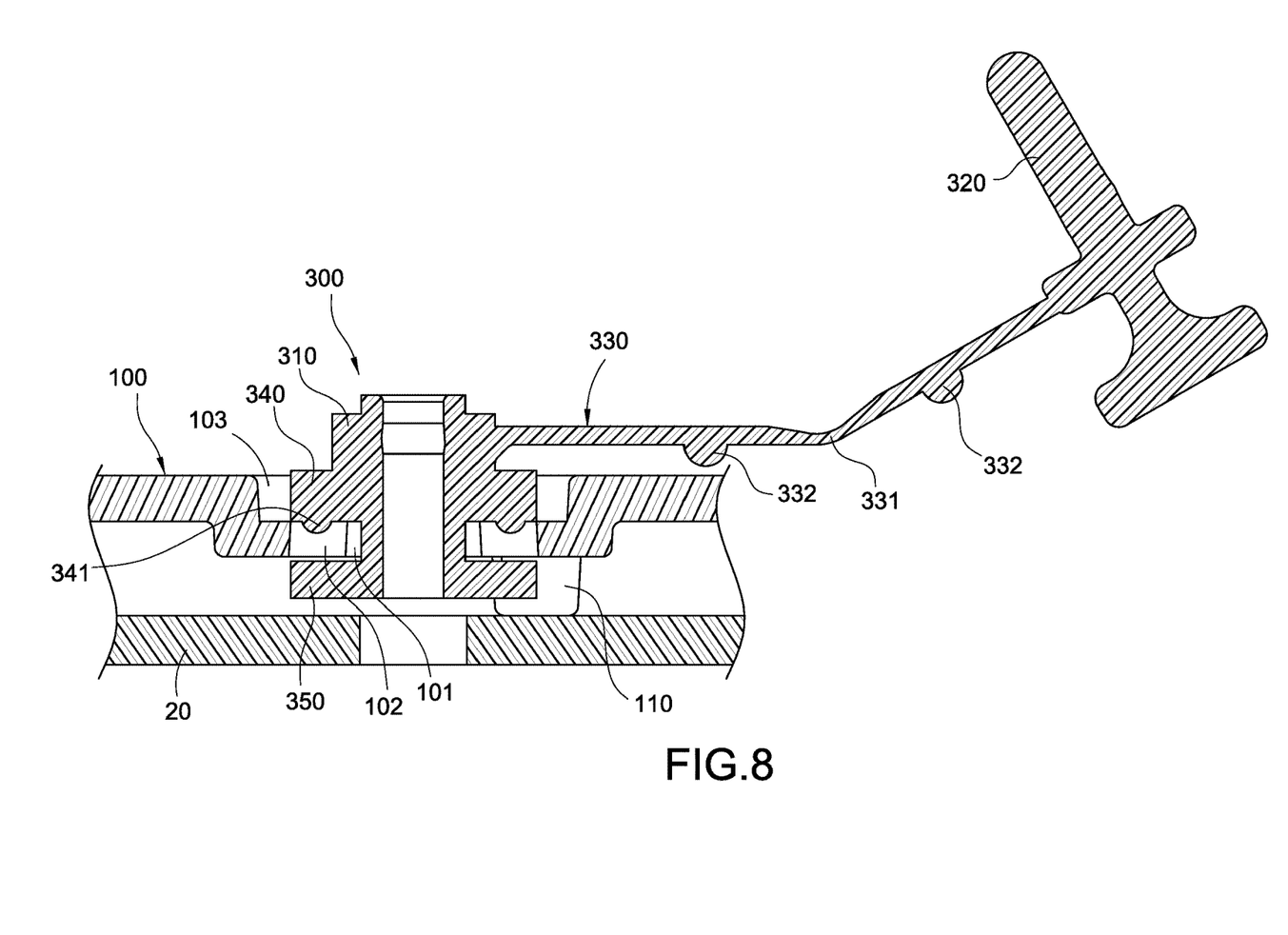
Figure 9:
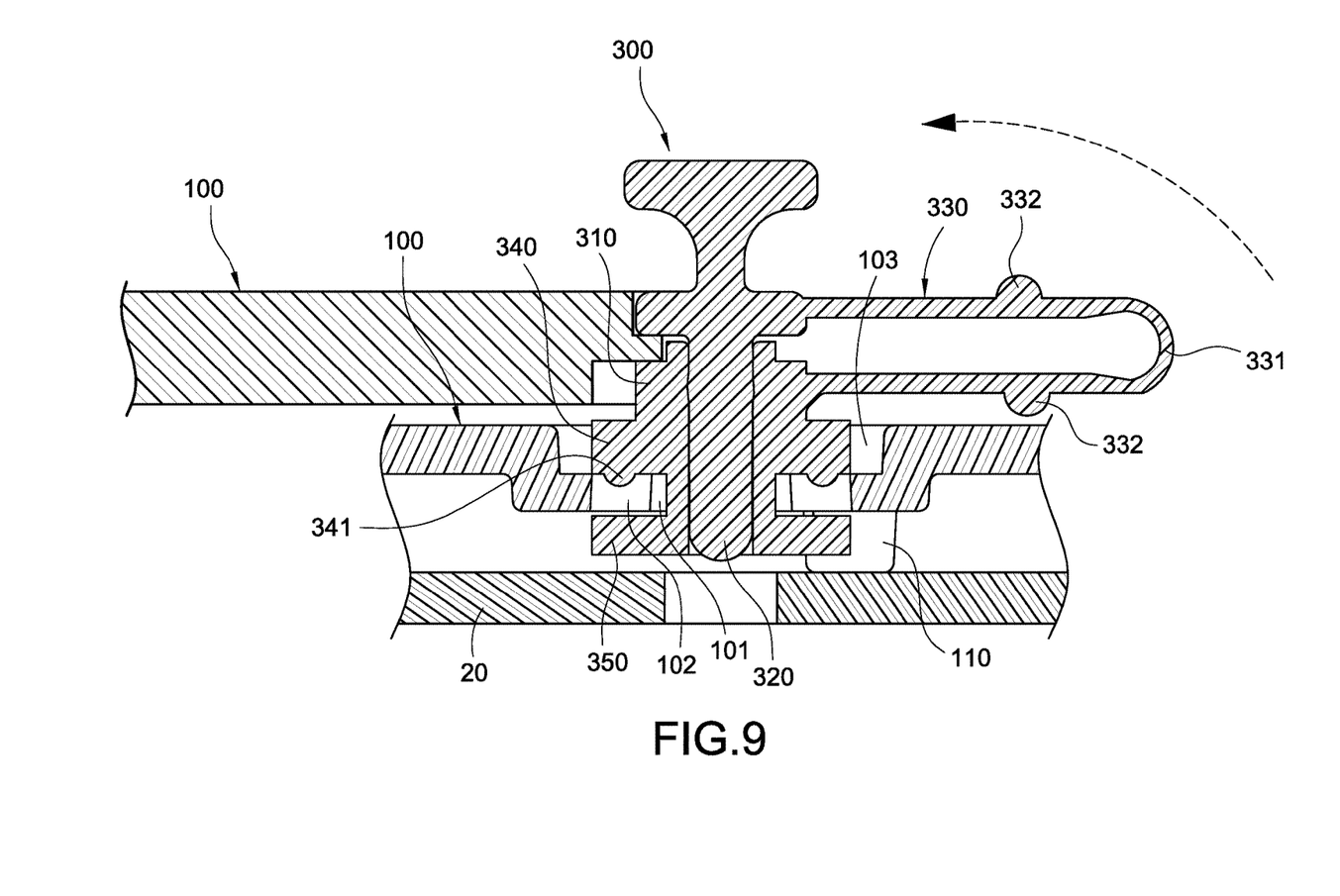

Please refer to FIG. 3 to FIG. 5, the arm latch 210 of the positioning buckle 200 is inserted in one of the position hole 101 and engaged with the circuit board 20, the supporting arm 230 of the positioning buckle 200 is contacted with the circuit board 20 and the circuit board 20 is thereby clamped between the arm latch 210 and the supporting arm 230 to fix the positioning buckle 200 with the circuit board 20. The positioning buckle 200 is inserted in the position hole 101 and further twisted 90 degrees, and the wall 220 thereof is thereby contacted with the carrier plate 100. The protruding block 221 on the positioning buckle 200 is engaged with each snapping hole 102 nearby the position hole 101 containing the positioning buckle 200. Thereby, the carrier plate 100 is fixed on the circuit board 20. Preferably, the wall 220 of the positioning buckle is contained in corresponding recess 103 without protruding the surface of the carrier plate 100 and thereby preventing from interfering with the expansion card 10.

Please refer to FIG. 6 to FIG. 10, pressing block 300 is inserted in another position hole 101 and engaged with an edge of the other end of the expansion card 10, and the expansion card 10 is thereby fixe and stacked on the circuit board 20. The pressing block 300 is inserted in the position hole 101 and further twisted 90 degrees about an axial direction of the shaft sleeve 310 and the carrier plate 100 is thereby clamped by the couple of walls 340/350, and the protruding block 341 on the pressing block 300 is engaged with each snapping hole 102 nearby the position hole 101 containing the pressing block 300. Thereby, the pressing block 300 is fixed on the carrier plate 100. The connecting strip 330 is folded along the folding groove 331, the fixing rod 320 is inserted in the shaft sleeve 310, and the edge of the expansion card 10 is thereby clamped between the shaft sleeve 310 and the fixing rod 320, to fix the expansion card 10. The connecting strip 330 is reinforced by the respective reinforcing ribs 332 at two ends of the folding groove 331 to result in more strength difference with the folding groove 331. Thereby, stress is concentrated at the weaker folding groove 331 while the connecting strip 330 is folded, to prevent the other portion of the connecting strip 330 from folding.

Figure 11:
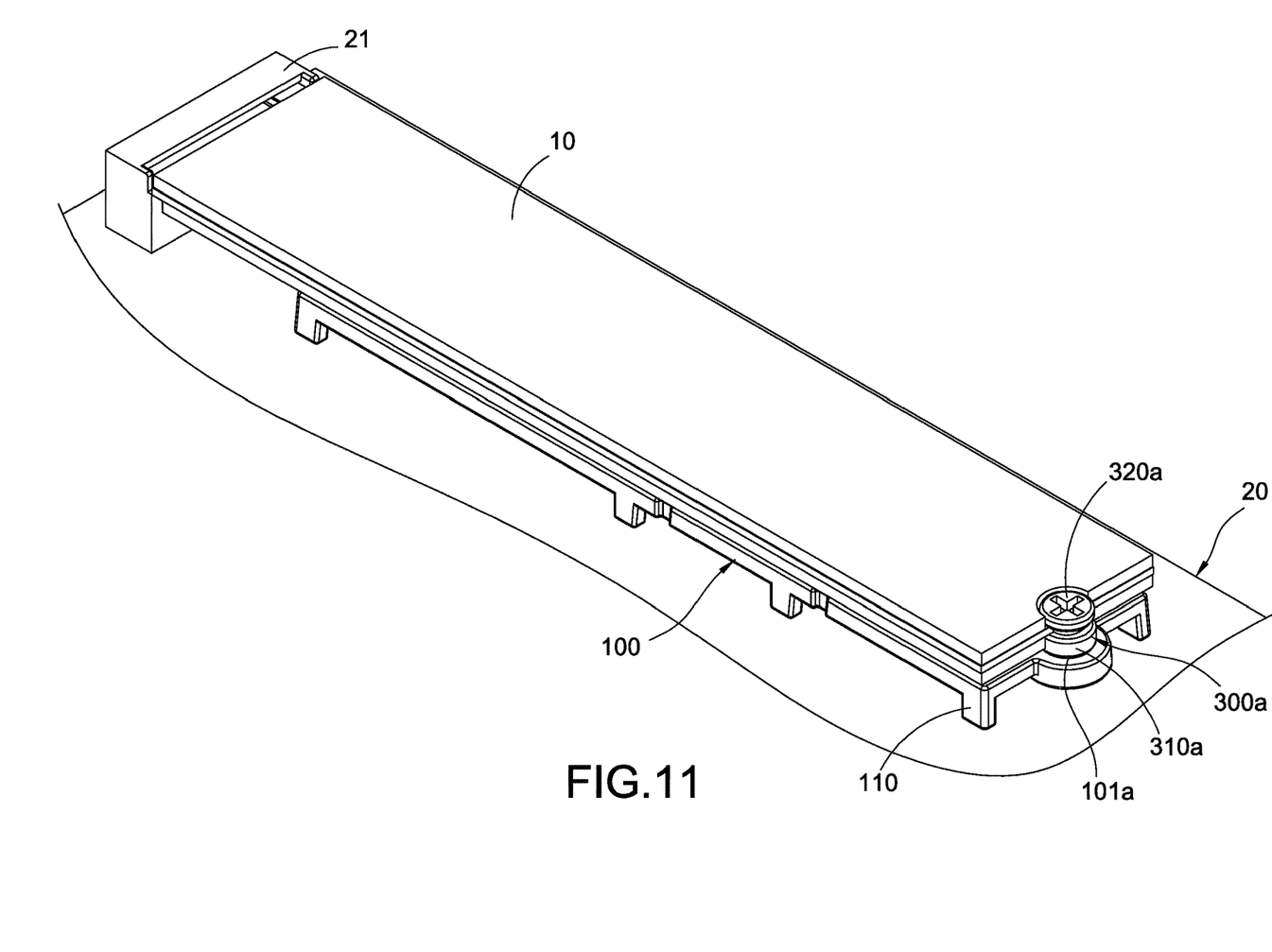
FIGS. 11 and 12 are schematic diagrams showing another embodiment of the pressing block.
Figure 12:
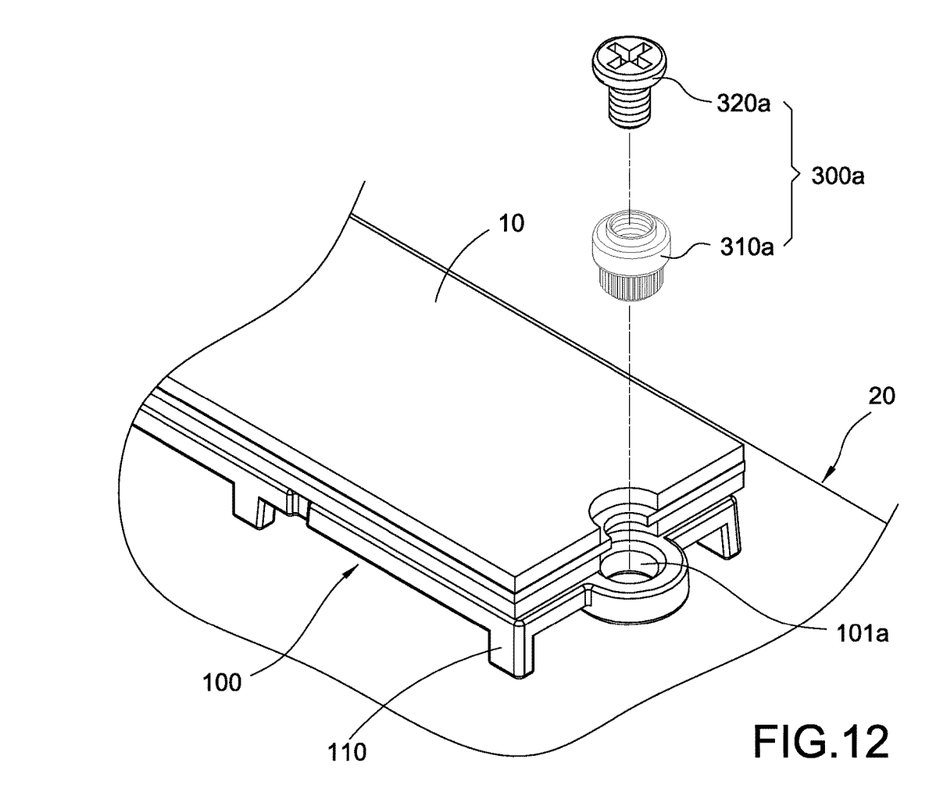

Please refer to FIGS. 11 and 12. A suitable position hole 101a could be selected corresponding to various length sizes of expansion cards 10. Furthermore, according to another embodiment of the pressing block 300a, the fixing rod 320a could be a screw bolt, the shaft sleeve 310a is inserted in the circular position hole 101a, the fixing rod 310a is screw connected with the shaft sleeve 310a and the edge of the expansion card 10 is clamped between the shaft sleeve 310a and the fixing rod 320a, and the expansion card 10 is thereby fixed.

Figure 13:
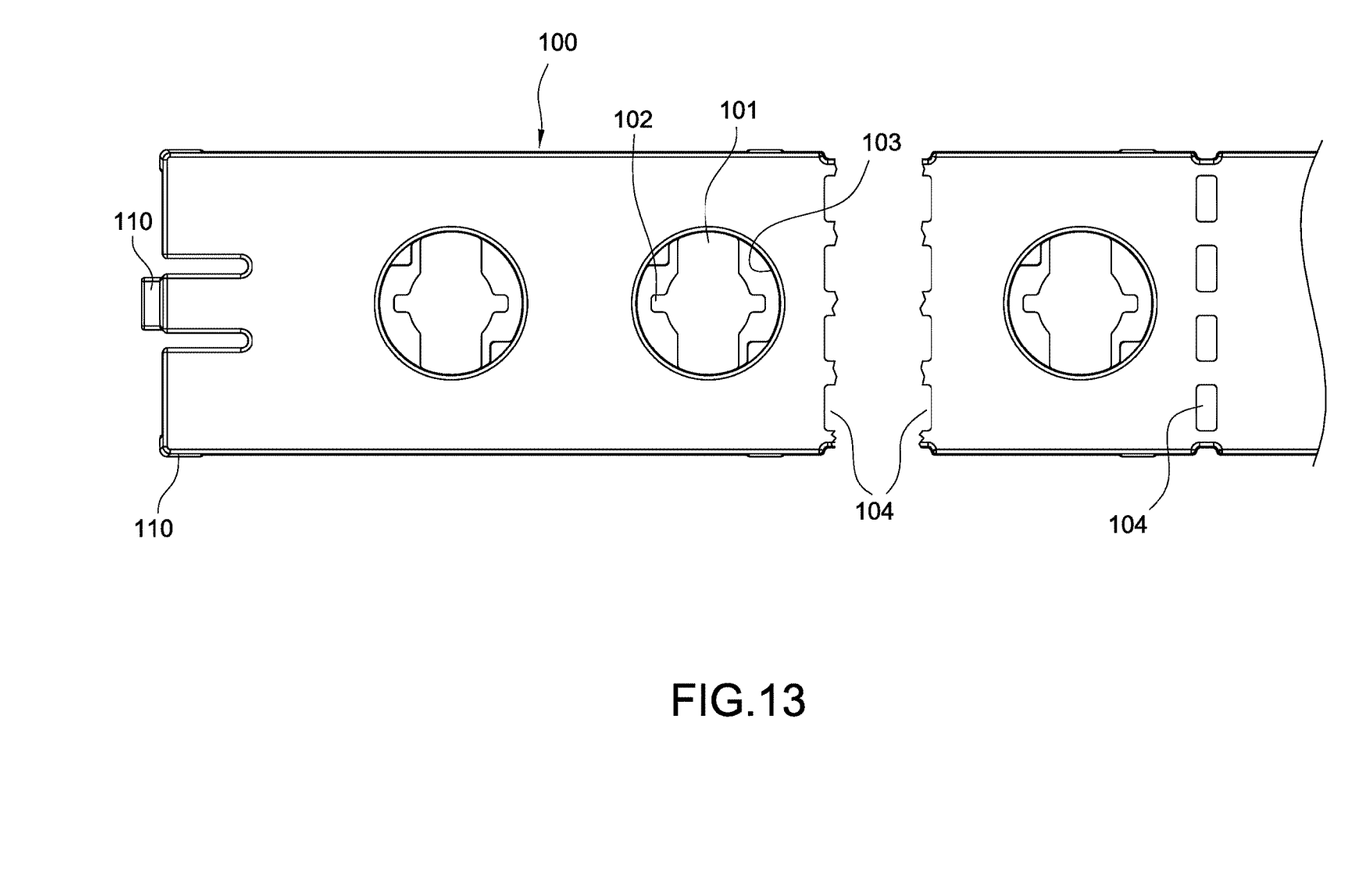
FIG. 13 is a schematic diagram showing another usage of the expansion card holder of the present embodiment of the present disclosure.

Please refer to FIG. 13, at least a broken-hole line 104 is defined on the carrier plate 100, and the broken-hole line 104 is extended along a lateral direction of this row of position holes 101 to cross the carrier plate 100, and the carrier plate 100 thereby could be folded to fracture along the broken-hole line 104 according to various requirements of installation spaces.

Accordingly, the expansion card holder of the present disclosure is compatible with various sizes of M.2 expansion cards 10 by the carrier plate 100 thereof, and able to fix M.2 expansion card 10 on the circuit board 20. Moreover, the expansion card holder of the present disclosure is further compatible with various installation spaces.

Figure 14:
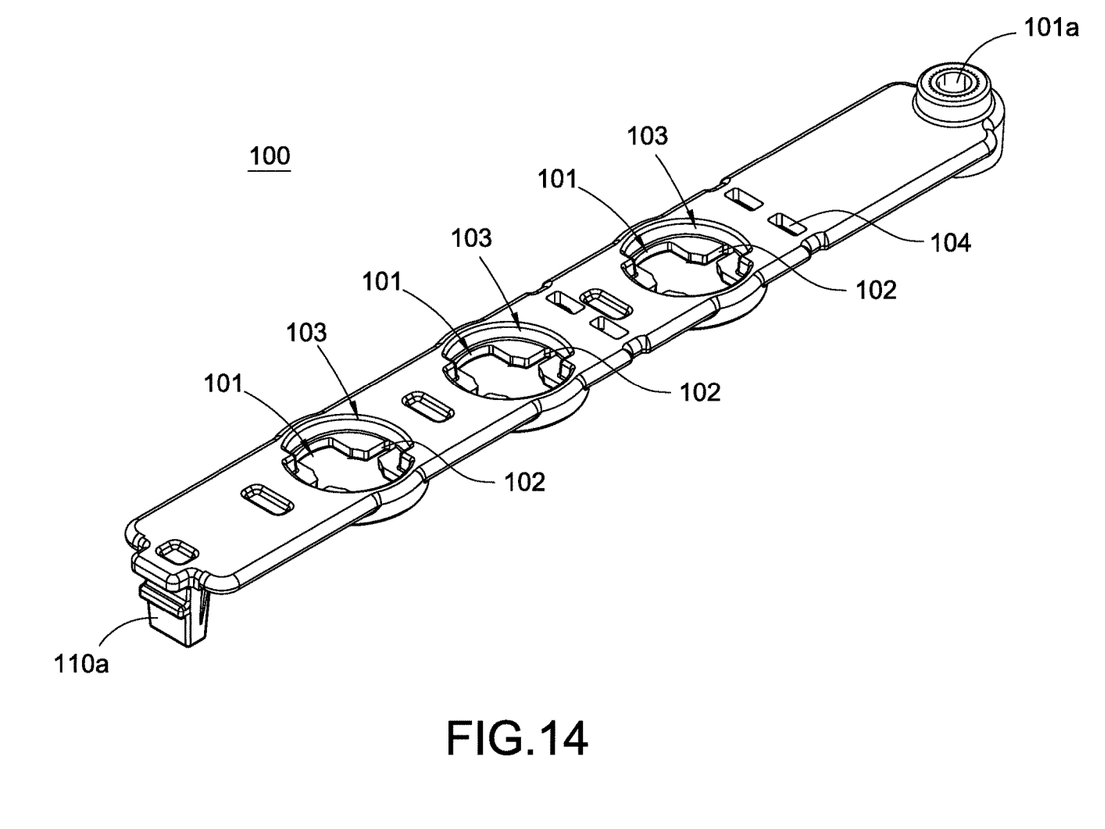
FIGS. 14 and 15 are schematic diagrams showing another embodiment of the carrier plate.
Figure 15:
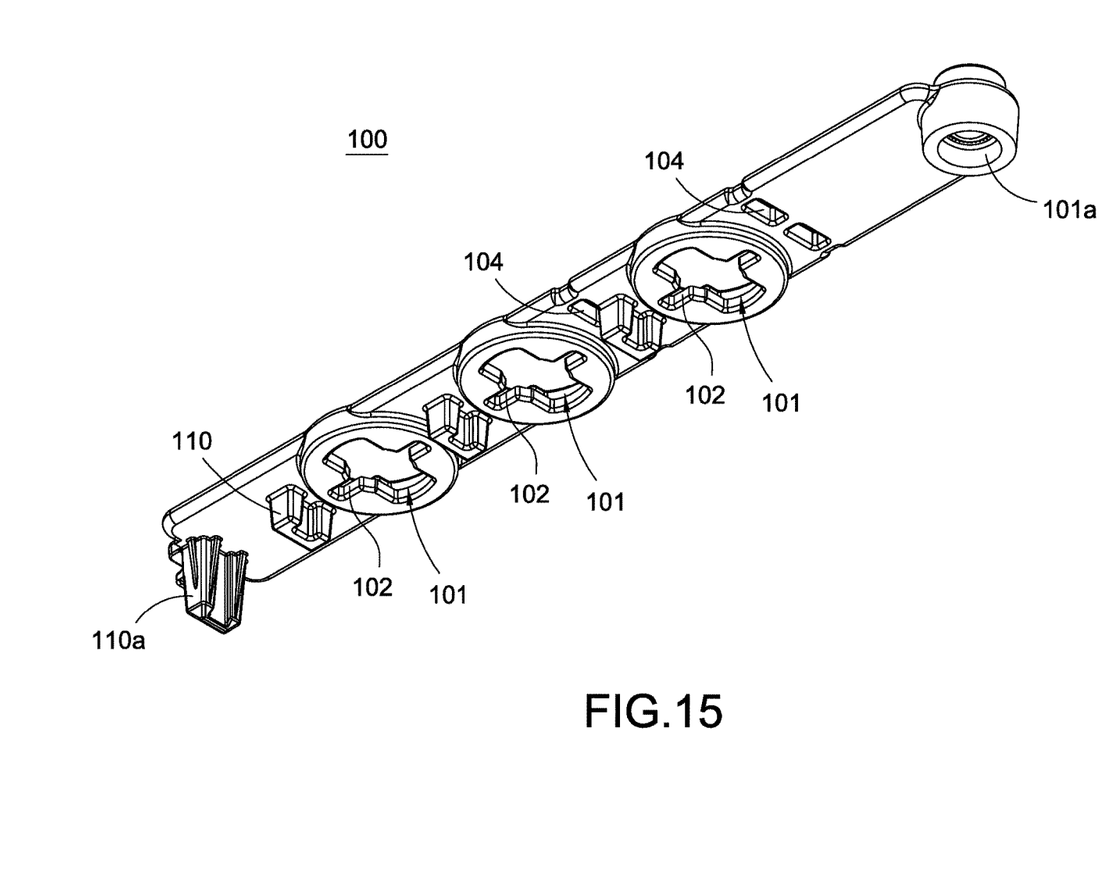

Detail structures of the carrier plate 100 should not be limited by embodiments of the present disclosure. For example, another embodiment of the carrier plate is shown in FIGS. 14 and 15. In the present embodiment, the carrier plate 100 is slimmer than aforementioned embodiment, a length of at least a position hole 101 is longer than a width of the carrier plate 100, and parts of edge of the plate 100 protrudes to contain the position hole 101.

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the present disclosure as defined in the appended claims.

What is claimed is:

1. An expansion card holder for fixing an expansion card on a circuit board, a connector being arranged on the circuit board, an end of the expansion card being coupled with the connector, the expansion card holder comprising:
    a carrier plate fixed on the circuit board, a plurality of position holes arranged in a row being defined on the carrier plate;
    a positioning buckle inserted in any one of the position holes and engaged with the circuit board; and
    a pressing block inserted in another one of the position holes and engaged with the expansion card.

2. The expansion card holder according to claim 1, wherein a couple of walls arranged at interval are formed on the pressing block, and the carrier plate is clamped by the couple of walls.

3. The expansion card holder according to claim 2, wherein the position hole is an elongated hole of a shape matched with the wall, the pressing block is inserted in the position hole and further twisted, and the carrier plate is thereby clamped by the couple of walls.

4. The expansion card holder according to claim 2, wherein a snapping hole nearby at least one of the position holes is defined on the carrier plate, a protruding block is arranged on one of the walls of the pressing block, and the protruding block is engaged with the snapping hole of the position hole containing the pressing block.

5. The expansion card holder according to claim 1, wherein the pressing block comprising a shaft sleeve and a fixing rod, and the fixing rod is inserted in the shaft sleeve.

6. The expansion card holder according to claim 5, wherein the pressing block comprising a connecting strip, two ends of the connecting strip are respectively connected with the shaft sleeve and the fixing rod, a folding groove is formed on the connecting strip and the folding groove is extended along a lateral direction of the connecting strip, and a couple of reinforcing ribs are formed on the connecting strip at respective two ends of the folding groove.

7. The expansion card holder according to claim 1, wherein a wall is formed on the positioning buckle and the wall is in contact with the carrier plate.

8. The expansion card holder according to claim 7, wherein the positioning buckle is inserted in the position hole and twisted, and the wall is thereby contacted with the carrier plate.

9. The expansion card holder according to claim 7, wherein a snapping hole adjacent to at least one of the position holes is defined on the carrier plate, a protruding block is protruded on the wall of the positioning buckle, the protruding block is engaged with the snapping hole adjacent to the position hole containing the positioning buckle.

10. The expansion card holder according to claim 7, wherein a plurality of concave recesses are formed on the carrier plate and each position hole is formed at a bottom of each recesses, and the wall of the positioning buckle is received in the recesses.

11. The expansion card holder according to claim 1, wherein at least a supporting arm is extended from the positioning buckle.

12. The expansion card holder according to claim 1, wherein at least a broken-hole line is defined on the carrier plate, the broken-hole line is extended along a lateral direction of the row of position holes.

13. The expansion card holder according to claim 1, wherein a plurality of legs for raising the carrier plate are extended from the carrier plate.

14. The expansion card holder according to claim 1, wherein all of the plurality of position holes are not in direct contact with the circuit board.

* * * * *